(12) United States Patent
Sanchez et al.

(10) Patent No.: US 9,159,554 B2
(45) Date of Patent: Oct. 13, 2015

(54) STRUCTURE AND METHOD OF FORMING METAMORPHIC HETEROEPI MATERIALS AND III-V CHANNEL STRUCTURES ON SI

(71) Applicant: Applied Materials, Inc., Santa Clara, CA (US)

(72) Inventors: Errol Antonio C. Sanchez, Tracy, CA (US); Xinyu Bao, Mountain View, CA (US); Wonseok Lee, Pleasanton, CA (US); David Keith Carlson, San Jose, CA (US); Zhiyuan Ye, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/262,400

(22) Filed: Apr. 25, 2014

(65) Prior Publication Data
US 2014/0329376 A1 Nov. 6, 2014

Related U.S. Application Data

(60) Provisional application No. 61/822,541, filed on May 13, 2013, provisional application No. 61/818,228, filed on May 1, 2013.

(51) Int. Cl.
*H01L 21/8238* (2006.01)
*H01L 21/02* (2006.01)
*H01L 21/762* (2006.01)

(52) U.S. Cl.
CPC ...... *H01L 21/02546* (2013.01); *H01L 21/0243* (2013.01); *H01L 21/0262* (2013.01); *H01L 21/02381* (2013.01); *H01L 21/02433* (2013.01); *H01L 21/02463* (2013.01);
(Continued)

(58) Field of Classification Search
CPC ............... H01L 21/02387; H01L 21/02428; H01L 21/0243; H01L 21/02433; H01L 21/02463; H01L 21/02516; H01L 21/30604; H01L 21/30608; H01L 21/30612; H01L 21/30617
USPC ......... 438/221, 222, 479, 481, 492, 604, 605, 438/606, 607, 622, 637, 702, 703, 704, 706, 438/745, 761, 763, 778
See application file for complete search history.

(56) References Cited

U.S. PATENT DOCUMENTS

| | | | | |
|---|---|---|---|---|
| 5,872,022 | A | * | 2/1999 | Motoda et al. .................. 438/39 |
| 7,928,427 | B1 | * | 4/2011 | Chang ............................. 257/24 |
| 2007/0200135 | A1 | * | 8/2007 | Wang ............................ 257/103 |

(Continued)

OTHER PUBLICATIONS

Bolkhovityanov, Y.B., et al., "III-V Compounds-on-Si: Heterostructure Fabrication, Appliation and Prospects", The Open Nanoscience Journal, Oct. 2009, vol. 3, Issue 1, pp. 20-33.
(Continued)

*Primary Examiner* — Kyoung Lee
*Assistant Examiner* — Joannie A Garcia
(74) *Attorney, Agent, or Firm* — Patterson & Sheridan, LLP (57) ABSTRACT

Embodiments described herein generally relate to a method of fabrication of a device structure comprising Group III-V elements on a substrate. A <111> surface may be formed on a substrate and a Group III-V material may be grown from the <111> surface to form a Group III-V device structure in a trench isolated between a dielectric layer. A final critical dimension of the device structure may be trimmed to achieve a suitably sized node structure.

17 Claims, 5 Drawing Sheets

(52) U.S. Cl.
CPC ... *H01L 21/02502* (2013.01); *H01L 21/02639* (2013.01); *H01L 21/762* (2013.01)

(56) References Cited

U.S. PATENT DOCUMENTS

2008/0267239 A1* 10/2008 Hall et al. .............. 372/46.013
2010/0270591 A1* 10/2010 Ahn ........................... 257/194

OTHER PUBLICATIONS

Cuypers, D., et al., "Wet Chemical Etching of InP for Cleaning Applications", ECS Journal of Solid State Science and Technology, vol. 2, Issue 4, pp. P185-P189.

Li, J.Z., et al., "Defect reduction of GaAs epitaxy on Si (001) using selective aspect ratio trapping", Applied Physics Letters, vol. 91(2), Jul. 9, 2007, pp. 021114-1-021114-3.

Park, J-S, et al., "Defect reduction of selective Ge epitaxy in trenches on Si(001) substrates using aspect ratio trapping", Applied Physics Letters, Jan. 2007, vol. 90, Issue 5, pp. 052113-1-052113-3.

Pribat, D., et al., "Defect-free, conformally grown (100) GaAs films", 1990 American Institute of Physics, Applied Physics Letters vol., 57, Issue 4, 23 Jul. 23, 1990, pp. 375-377.

Pribat, D., et al., "High quality GaAs on Si by conformal growth", 1992 American Institute of Physics, Applied Physics Letters vol. 60, Issue 17, Apr. 27, 1992, pp. 2144-2146.

Radosavljevic, M., "Electrostatics Improvement in 3-D Tri-gate Over Ultra-Thin Body Planar InGaAs Quantum Well Field Effect Transistors with High-K Gate Dielectric and Scaled Gate-to-Drain/Gate-to-Source Separation", Electron Devices Meeting (IEDM), 2011 IEEE International, 2011, pp. 33.1.1-33.1.4.

Wang, G., et al., "Selective Area Growth of InP in Shallow-Trench-Isolated Structures on Off-Axis Si(001) Substrates", Journal of the Electrochemical Society, Sep. 2010, vol. 157, Issue 11, pp. H1023-H1028.

Wu, et al., "First Experimental Demonstration of 100 nm Inversion-mode InGaAs FinFET through Damange-free Sidewall Etching", Electron Devices Meeting (IEDM), 2009, IEEE International, Dec. 7-9, 2009, pp. 13.4.1-13.4.4.

* cited by examiner

STRUCTURE AND METHOD OF FORMING METAMORPHIC HETEROEPI MATERIALS AND III-V CHANNEL STRUCTURES ON SI

CROSS-REFERENCE TO RELATED APPLICATIONS

This application claims benefit of U.S. Provisional Patent Application Ser. No. 61/822,541, filed May 13, 2013, and U.S. Provisional Patent Application Ser. No. 61/818,228, filed May 1, 2013, which are both herein incorporated by reference.

FIELD

Embodiments described herein generally relate to heteroepitaxial growth of materials that have high lattice mismatch to silicon (Si) for microelectronic applications. Further embodiments described herein generally relate to the use of III-V elements as high mobility transistor channels in metal oxide semiconductor field effect transistors (MOSFETS) for Si very large scale integration (VLSI) microelectronics. More specifically, embodiments described herein relate to structures and methods of forming metamorphic heteroepi materials and III-V channel structures on Si.

BACKGROUND

Group III-V elements may be advantageous in certain applications for silicon-based devices, for example, source/drain materials or the like, due to low contact resistance and the ability to function as a stressor for mobility enhancement in silicon-based devices. However, defects during heteroepitaxy of Group III-V elements on silicon arise from material incompatibilities such as large lattice mismatch (>4%), valence difference, thermal property differences, and conductivity differences. The defects may include dislocations, antiphase boundaries, and stacking faults for Group III-V layers. Group III-V features are frequently formed in trenches. However, with smaller device size requirements, Group III-V element growth inside high aspect ratio (depth vs. opening width) trenches becomes increasingly difficult.

Group III-V element channels are generally formed in an array of nanometer scale planar or vertical structures with critical dimensions of about 5-15 nm and depths of about 20-100 nm. Requirements for high quality Group III-V element channels are desired, such as having minimal defects ($<10^{-5}/cm^2$), consistent and controlled composition and morphology, and no parallel conduction of carriers other than in the active device region of the channel structures. Forming high quality Group III-V element channels is challenging given the desire for increasingly small device sizes and the aforementioned minimization of defects present in the devices.

Thus, there is a need for high quality Group III-V element channels with small device sizes.

SUMMARY

Embodiments described herein generally relate to a method of fabrication of a device structure comprising Group III-V elements.

In one embodiment, a method of forming a device structure is provided. The method includes providing a substrate having a surface oriented in a <111> direction and forming a trench having a first region and a second region, the trench comprising a plurality of sidewalls, wherein the plurality of sidewalls contact the substrate below the surface oriented in a <111> direction. A first layer is deposited on the surface oriented in a <111> direction. A second layer is deposited on the first layer. A third layer is deposited on the second layer. Each of the first layer, second layer, and third layer independently comprise at least one of a Group III element and at least one of a Group V element.

In another embodiment, a method of forming a device structure is provided. The method includes providing a substrate having a surface oriented in a <111> direction and forming a trench having a first region and a second region, and a depth, the trench comprising a plurality of sidewalls, wherein the plurality of sidewalls contact the substrate below the surface oriented in a <111> direction. A first layer is deposited on the surface oriented in a <111> direction. A second layer is deposited on the first layer. A third layer is deposited on the second layer. Each of the first layer, second layer, and third layer independently comprise at least one of a Group III element and at least one of a Group V element. A portion of the plurality of sidewalls is removed to expose a portion of the third layer and the third layer is etched to reduce a critical dimension of the third layer.

In yet another embodiment, a method of forming a device structure is provided. The method includes providing a substrate having a silicon-containing surface oriented in a <111> direction and forming a trench having a first region and a second region, the trench comprising a plurality of dielectric sidewalls, wherein the plurality of dielectric sidewalls contact the substrate below the silicon-containing surface oriented in a <111> direction. A first layer comprising GaAs is epitaxially deposited on the silicon-containing surface oriented in a <111> direction. A second layer comprising $In_{0.3}Ga_{0.7}As$ is epitaxially deposited on the first layer. A third layer comprising $In_{0.53}Ga_{0.47}As$ is epitaxially deposited on the second layer. The third layer is masked, a portion of the plurality of dielectric sidewalls is removed to expose a portion of the third layer, and the third layer is anisotropically wet etched to reduce a critical dimension of the third layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein generally relate to a method of fabrication of a device structure comprising Group III-V elements on a substrate. A <111> surface may be formed on a substrate and a Group III-V material may be grown from the <111> surface to form a Group III-V device structure in a trench isolated between a dielectric layer. A <111> surface may generally be defined as a family of lattice planes which are symmetric in each of the Miller indices. A final critical dimension of the device structure may be trimmed to achieve a suitably sized node structure.

Figure 1:
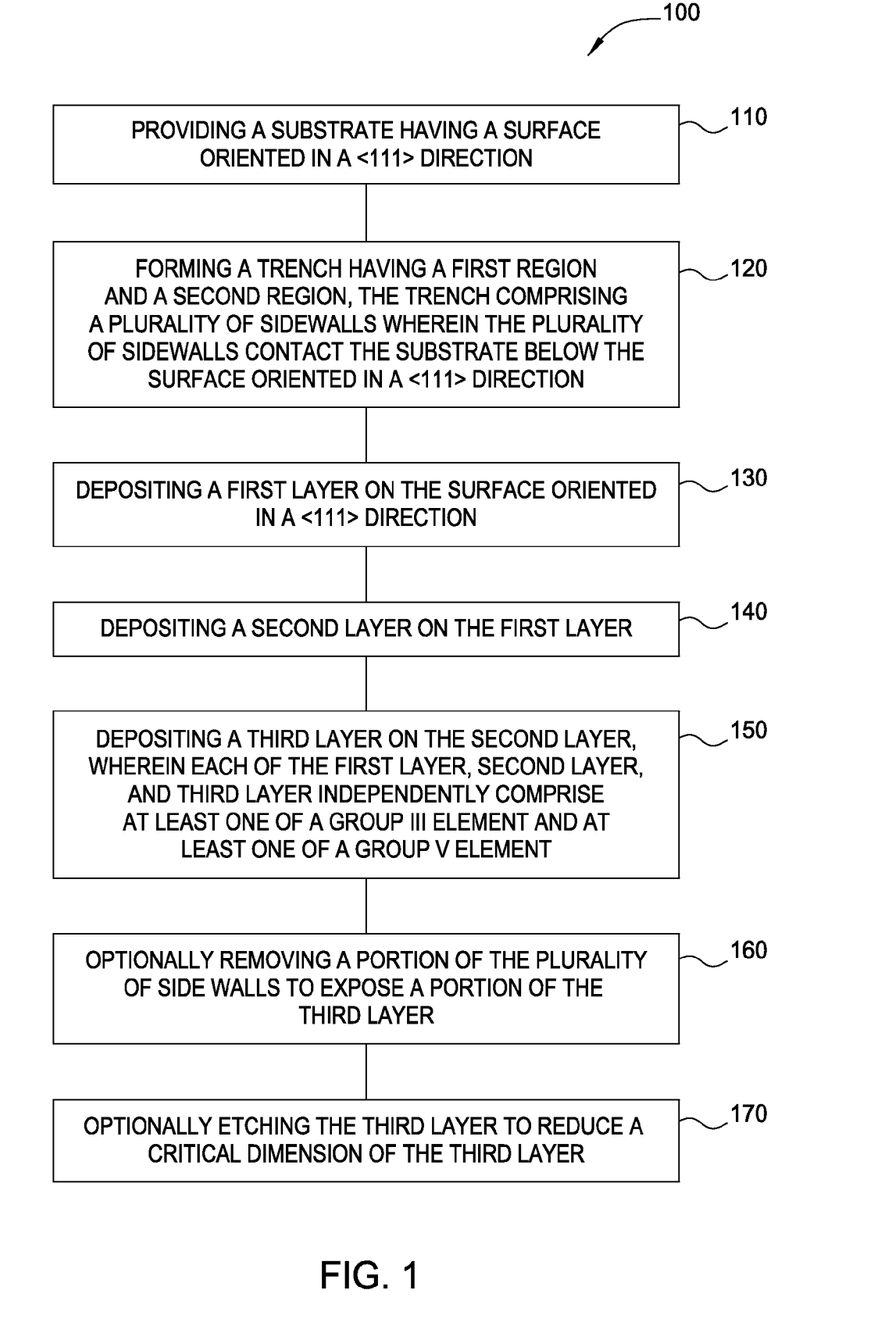
FIG. 1 depicts a method of forming a device structure comprising Group III-V elements on a substrate according to certain embodiments described herein.
Figure 2A:
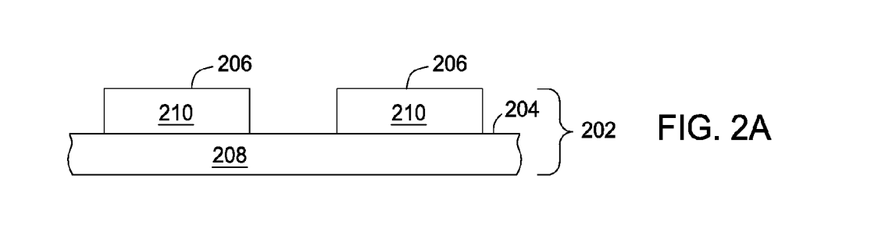
FIGS. 2A-2C depict stages of fabrication of a <111> surface on a substrate according to certain embodiments described herein.
Figure 2B:
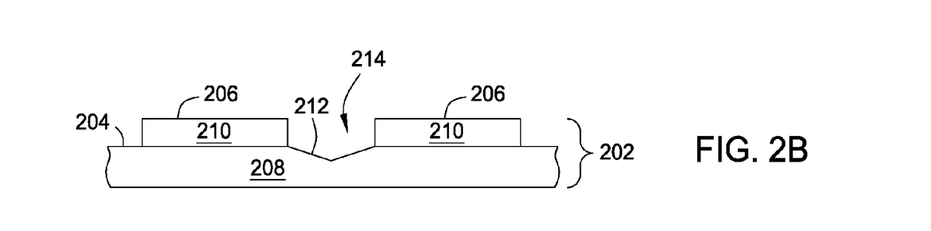
Figure 2C:
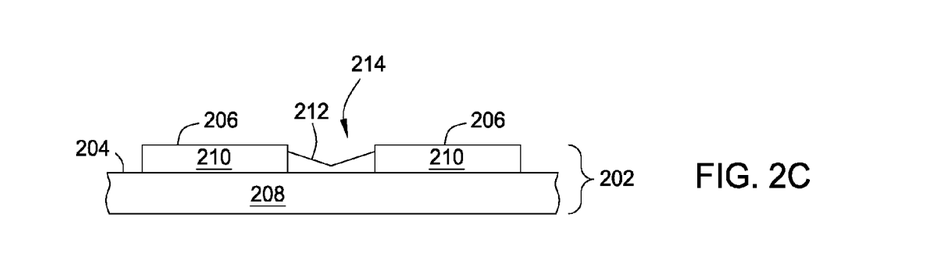

FIG. 1 depicts a method 100 of forming a device structure comprising Group III-V elements on a substrate. FIGS. 2A-2C are cross-sectional views of a substrate 202 at various stages of the method 100. The method 100 is described below in accordance with stages of fabrication of a <111> surface on a substrate as illustrated in FIGS. 2A-2C in accordance with certain embodiments described herein. As illustrated in FIG. 2A, a substrate 202 may include a first surface 204 and a second surface 206. In certain embodiments, the first surface 204 may comprise a silicon-containing surface. The silicon-containing substrate 208 may include germanium (Ge), carbon (C), boron (B), phosphorous (P) or other known elements that may be co-grown, doped, and/or associated with silicon materials.

In certain embodiments, the second surface 206 may be part of a dielectric layer 210 disposed on the silicon-containing substrate 208. For example, the dielectric layer 210, such as a shallow trench isolation (STI) oxide, may comprise one or more of silicon nitride (SiN), silicon dioxide ($SiO_2$), silicon oxynitride (SiON) or other suitable materials that may be used to form a dielectric layer. The embodiments of the substrate 202 depicted in FIG. 2A are merely exemplary and other suitable configurations of the substrate are possible. For example, as illustrated in FIG. 2A, the substrate 202 may be part of a partially formed device, such as a planar metal-oxide-semiconductor field effect transistor (MOSFET). However, other devices, such as fin shaped field effect transistors (FinFETs) or the like maybe used with the inventive methods provided herein.

The method 100 at operation 110 provides a substrate having a surface oriented in a <111> direction. The silicon-containing surface, such as the first surface 204 (FIG. 2A) may be oriented in the <111> direction. As illustrated in FIG. 2B, a silicon-containing surface 212 oriented in a <111> direction may be formed through etching. The first surface 204 may be oriented in a direction other than the <111> direction, for example the <100> direction, and the silicon-containing substrate 208 may be etched to form the silicon-containing surface 212 oriented in the <111> direction. The <111> surface 212 may be part of a source/drain region 214 formed in the first surface 204 of the silicon-containing substrate 208 between the dielectric layers 210. Any suitable etch process may be utilized to form the <111> surface 212, such as wet or dry etch methods, or plasma assisted etching methods. In certain embodiments, a dry etch method, such as a thermal chlorine ($Cl_2$) etch may be used. Generally, etch processes associated with the embodiments provided herein may be performed at temperatures of about 750° C. or below, such as between about 50° C. and about 500° C. The temperatures of the etch processes as specified above may be necessary in certain applications, for example, to prevent silicon reflow as the source/drain region 214 is etched.

As is common with crystallographic planes, the <111> surface 212 will form a specific angle to relative the known orientation of the first surface 204. Thus, formation of the <111> surface 212 may be verified by any suitable crystallographic analytical technique, such as x-Ray diffraction, electron diffraction, or other suitable methods.

In another embodiment, as illustrated in FIG. 2C, the silicon-containing substrate 208 having the first surface 204 oriented in a direction other than the <111> direction may be etched to a <111> surface 212 in the source/drain region 214. In this embodiment, the material in the source/drain region 214 may be substantially flush with the second surface 206 prior to etching. The etching process may be similar to the process described with regard to FIG. 2B above.

The method 100 is further described in accordance with stages of fabrication of a device structure comprising Group III-V elements as illustrated in FIGS. 3A-3D. The method 100 continues at operation 120 (FIG. 1), illustrated in FIG. 3A, by forming a trench 315 having a first region "a" and a second region "b." A plurality of sidewalls 313 contact the silicon-containing substrate 208 below the <111> surface 212 at a contact region 317.

Figure 3A:
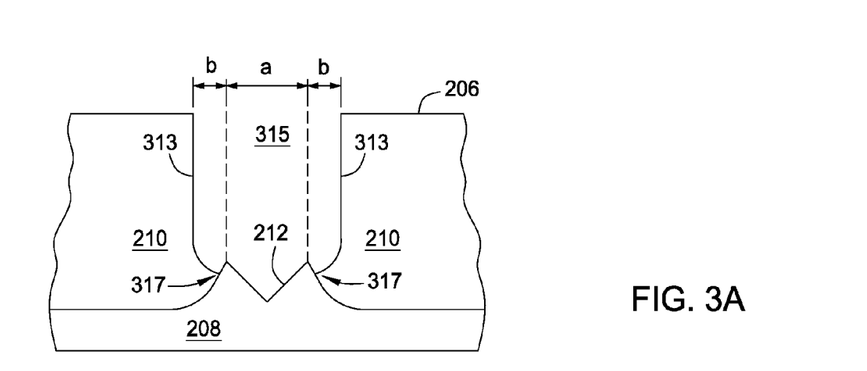
FIGS. 3A-3D depict stages of fabrication of a device structure comprising Group III-V elements according to certain embodiments described herein.

The structure of the trench 315, such as the width of the trench 315 and location of the contact region 317, may be formed by etching the dielectric layer 210 to achieve the desired characteristics. Suitable methods of etching the dielectric layer 210, such as anisotropic dry etching or an in-situ dry clean process of the <111> surface 212, may be used to form the trench 315 and contact region 317. In one embodiment, the trench may be formed by exposing the plurality of sidewalls 313 to an $NH_3/NF_3$ remote plasma at room temperature and subsequently heating the substrate to about 100° C. However, it is contemplated that other methods of etching may also be used to form the trench 315 and the contact region 317.

In certain embodiments, the plurality of sidewalls 313, which define the width of the trench 315 and location of the contact region 317, may be substantially perpendicular to a horizontal plane (i.e. vertical) of the silicon-containing substrate 208 over a substantial portion of a depth of the trench 315. A portion of the plurality of sidewalls 313 near the contact region 317 may be substantially non-vertical in order to enable the plurality of sidewalls 313 to contact the silicon-containing substrate 208 below the <111> surface 212. Although shown as having a curvature in FIG. 3A, the portion of the plurality of sidewalls 313 disposed between the contact region 317 and the substantially vertical portion of the plurality of sidewalls 313 may take various shapes to allow for the plurality of sidewalls 313 to contact the silicon-containing substrate 208 below the <111> surface 212 at the contact region 317.

In one embodiment, the first region "a" may have a width substantially equal to a width of the <111> surface 212. The second region "b" may be formed such that the second region "b" is disposed between the plurality of sidewalls 313 and the first region "a." The first region "a" may have a width of between about 20 Å and about 600 Å and the second region "b" may have a width between about 10 Å and about 200 Å.

Figure 3B:
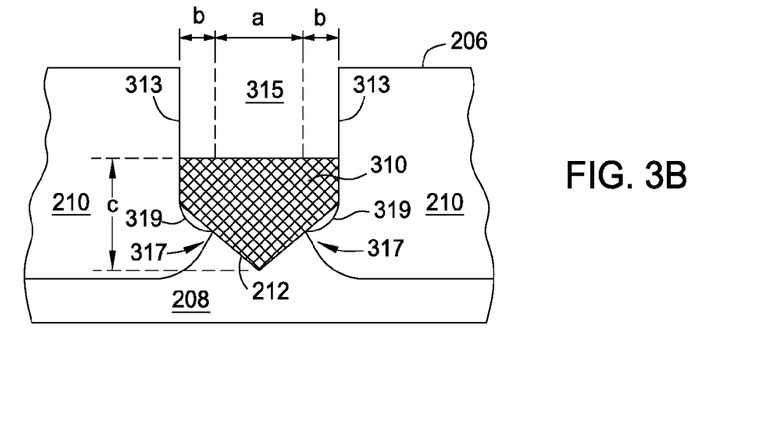

At operation 130 of FIG. 1, as illustrated in FIG. 3B, a first layer 310 may be deposited on the <111> surface 212. The first layer 310 may include at least one of a first Group III element and/or a first Group V element. The Group III or Group V elements may be selected based on one or more factors, such as the ability to attain good coverage of the <111> surface 212 under temperature and pressure conditions used, the electrical requirements of the device being manufactured, the composition of a second layer (i.e. a second layer 320 as discussed below) to follow the first layer 310, or other suitable factors.

The first layer 310 may be deposited by any suitable deposition method, such as reduced pressure chemical vapor deposition (CVD), epitaxial deposition, or any other suitable deposition method. The first layer 310 may be deposited from one or more Group III or Group V source materials. Exemplary Group III and Group V source materials may include tertiary butyl phosphorous, tertiary butyl arsenic, triethyl antimony, trimethyl antimony, triethyl gallium, trimethyl gallium, triethyl indium, trimethyl indium, indium chloride, indium phosphide, gallium chloride, trimethylaluminum, or organophosphorous compounds. In one embodiment, the first Group III element may comprise gallium (Ga) and/or aluminum (Al) and the first Group V element may comprise arsenic (As). The one or more Group III or Group V source materials may be in any suitable state, such as a solid or liquid that may be sublimed or vaporized, respectively, or in a gaseous state. The source materials may be metal organic precursors or the like.

The first layer 310 may comprise one or several monolayers of at least one of the first Group III element or the first Group V elements. In certain embodiments, only one of either the first Group III element or the first Group V element may be used. The selection of either the first Group III or Group V elements may be based on criteria as discussed above. In certain embodiments, the first layer 310 may comprise alternating monolayers of the first Group III and Group V elements. Alternating monolayers may be utilized when neither the first Group III nor the first Group V elements provide a distinct advantage over the other based upon the criteria as discussed above, or to provide a better nucleation surface for a second layer (i.e. a second layer 320 as discussed below) to be disposed atop the first layer 310.

The first layer 310 may be deposited substantially on the <111> surface 212 which corresponds to the first region "a." In embodiments where the <111> surface 212 comprises a silicon-containing surface, the first layer 310 may adapt to the silicon lattice structure. The first layer 310 may become strained and exhibit defects, such as dislocations and stacking faults as a result of the lattice mismatch between the silicon and the first layer 310. Other defects may arise such as anti-phase boundaries due to the polar nature of the first layer 310, or other defects due to differing thermal properties between silicon and the first layer 310. Thus, the first layer 310 may exhibit a high defect level near the <111> surface 212. However, as the first layer 310 is grown laterally beyond the first region "a" and away from the <111> surface 212, defects present in the first layer 310 in the first region "a" may terminate at the plurality of sidewalls 313 and through the second region "b."

Defect termination in the first layer 310 may be improved by the presence of a non-contact region 319. The non-contact region 319 results from the plurality of sidewalls 313 contacting the silicon-containing substrate 208 below the <111> surface 212 at the contact region 317. As a result of the crystal structure of the first layer 310 and the orientation of the <111> surface 212, the first layer may grow into the second region "b" without being provided into registry with any silicon-containing surface in the non-contact region 319. This allows the material of the first layer 310 to assume its natural lattice size in the second region "b." Thus, fewer defects form or originate in the second region "b" when compared to the first region "a."

As the first layer 310 extends laterally from the first region "a" into the second region "b" and vertically from the <111> surface 212, the first layer 310 may attain a substantially "defect free" material above a certain minimum thickness "c" within the trench 315. This minimum thickness "c" may be smaller, equal to, or larger than the width of the trench, which is the sum of the width of the first region "a" and two times a width of the second region "b." A "defect free" attribute may be defined as a (low) quantity of defects suitable for providing the electrical performance desired.

Where the width of the first region "a" is less than two times the width of the second region "b," defects may terminate most easily via the second region "b," such that the first layer 310 may be "defect free" above a minimum thickness "c" that is less than the width of the trench. In this embodiment, the thickness "c" of the first layer 310 above which the material is substantially "defect free" may be expressed as follows: c<a+2b when a<2b. For example, the first region "a" may have a width of about 20 Å and the second region "b" may have a width of about 30 Å. In another example, the first region "a" may have a width of about 20 Å and the second region "b" may have a width of about 20 Å. In the aforementioned embodiments, the need for high, or greater than 1, aspect ratios of the trench 315 to achieve low defectivity material is negated.

Where the width of the first region "a" is equal to two times the width of the second region "b," defects may terminate via the second region "b" such that the first layer 310 may be "defect free" but above a minimum thickness "c" that is equal to the width of the trench. In this embodiment, the thickness "c" of the first layer 310 above which the material is substantially "defect free" may be expressed as follows: c=a+2b when a=2b. For example, the first region "a" may have a width of about 20 Å and the second region "b" may have a width of about 10 Å. In another example, the first region "a" may have a width of about 40 Å and the second region "b" may have a width of about 20 Å. In the aforementioned embodiments, the aspect ratio of the trench 315 may be at least equal to 1 to achieve low defectivity material.

Where the width of the first region "a" is greater than two times the width of the second region "b," defects may terminate via the second region "b," such that the first layer 310 may be "defect free" only above a minimum thickness "c" that is greater than the width of the trench. In this embodiment, the thickness "c" of the first layer 310 to obtain a substantially defect free material may be expressed as follows: c>a+2b when a>2b. For example, the first region "a" may have a width of about 40 Å and the second region "b" may have a width of about 10 Å. In another example, the first region "a" may have a width of about 30 Å and the second region "b" may have a width of about 10 Å. In the aforementioned embodiments, the aspect ratio of the trench 315 is greater than 1 to achieve low defectivity material.

Figure 3C:
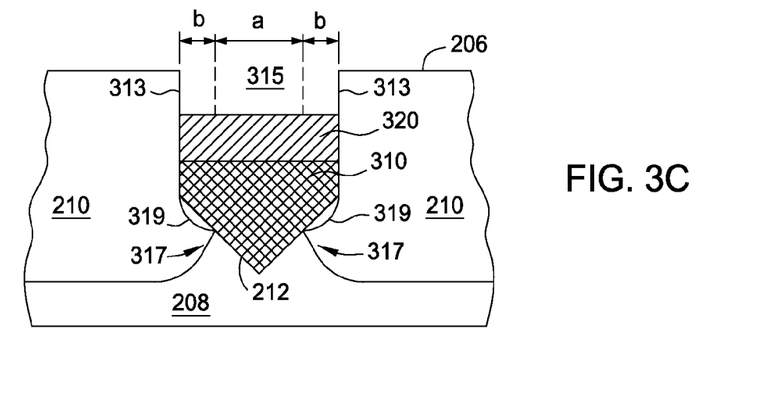

At operation 140, as illustrated in FIG. 3C, a second layer 320 may be deposited on the first layer 310. The second layer 320 may comprise a second Group III element and a second Group V element. In certain embodiments, the second Group III element may be the same or different from the first Group III element. Similarly, the second Group V element may be the same or different from the first Group V element. For example, differences may occur between the first and second elements such as when a particular first Group III or Group V element may be better for forming the first layer 310 based on the criteria discussed above, but a particular second Group III or Group V element may be better suited for forming a conduction barrier layer. The second layer 320 may act as a buffer between the first layer 310 and a third layer (i.e. layer 330 which will be discussed in detail below) and function to further terminate defects that may exist at the interface between the first layer 310 and the second layer 320.

In certain embodiments, the second layer 320 may comprise one of a binary or ternary Group III-V material. When the second layer 320 is a ternary material, the second layer 320 may further comprise at least one of an additional Group III element or an additional Group V element. In one embodiment, the second layer 320 may comprise indium, gallium, and arsenic. For example, the second layer 320 may comprise $In_{0.3}Ga_{0.7}As$ (molar ratio) and may be grown in the trench 315 to a region below the second surface 206.

The second layer 320 may be deposited using similar methods and source materials as discussed above for the first layer 310. The source materials may be co-flowed to deposit the second layer 320. In one embodiment, the second layer 320 may be deposited at a second temperature and a second pressure. Similar to the first temperature and the first pressure, the combination of the second temperature and the second pressure may provide selective deposition of the second layer 320 only on the first layer 310 disposed on the <111> surface 212. In certain embodiments, the second temperature may range from about 300° C. to about 600° C. The second temperature may be suitable to grow the second layer 320 to be a low defect density single crystalline layer adapted to further reduce defects present at the interface between the first layer 310 and the second layer 320. In certain embodiments, the second pressure may range from about 40 to about 400 Torr.

Figure 3D:
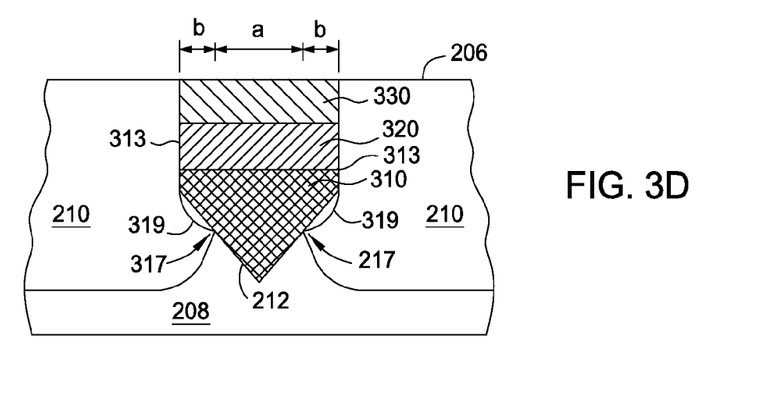

At operation 150, as illustrated in FIG. 3D, a third layer 330 may be deposited on the second layer 320. The third layer 330 may comprise a third Group III element and a third Group V element. In certain embodiments, the third Group III element may be the same or different from the second Group III element. Similarly, the third Group V element may be the same or different from the second Group V element. For example, differences may occur between the second and third elements such as when a particular second Group III or Group V element may be better for forming the second layer 320 based on the criteria discussed above, but a particular third Group III or Group V element may be better suited for forming a device layer having improved electron mobility or providing improved device layer characteristics.

In certain embodiments, the third layer 330 may comprise one of a binary or ternary Group III-V material. When the third layer 330 is a ternary material, the third layer 330 may further comprise at least one of an additional Group III element or an additional Group V element. In one embodiment, the third layer may comprise indium, gallium, and arsenic. In this embodiment, the third layer may comprise $In_{0.53}Ga_{0.47}As$ (molar ratio) and may be grown to a region substantially co-planar with the second surface 206 or may be grown beyond the second surface 206 to overfill the trench 315.

The third layer 330 may be deposited using similar methods and source materials as discussed above for the first layer 310 and second layer 320. The source materials may be co-flowed to deposit the third layer 330. In one embodiment, the third layer 330 may be deposited at a third temperature and a third pressure. Similar to the second temperature and the second pressure, the combination of the third temperature and the third pressure may provide selective deposition of the third layer 330 only on the second layer 320 disposed on the first layer 310. In certain embodiments, the third temperature may range from about 300° C. to about 600° C. In certain embodiments, the third pressure may range from about 40 to about 400 Torr. The third temperature and third pressure may be suitable to grow the third layer 330 to be a low defect density single crystalline layer having a defect density of less than about $10^5/cm^2$. In this embodiment, the crystal structure quality of the Group III-V material increases as the material is grown further away from the <111> surface 212 and towards the second surface 206.

Figure 4A:
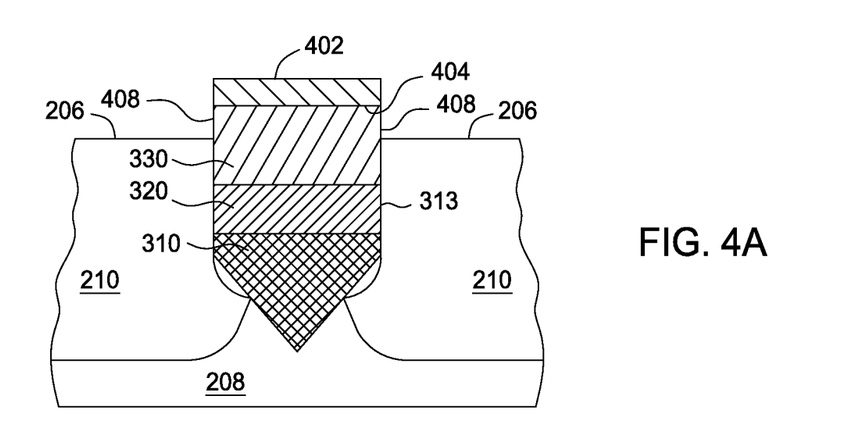
FIGS. 4A-4B depict stages of fabrication of a trimmed critical dimension device layer according to certain embodiments described herein.

Optionally, at operation 160, illustrated in FIG. 4A, a portion of the plurality of sidewalls 313 may be removed to expose a portion of the third layer 330. It should be noted that the third layer 330 and dielectric material 210 may be polished, such as by performing a chemical mechanical polishing process, to obtain a substantially planar surface prior to performing operation 160 if the third layer 330 was not flush filled to match the second surface 206 in previous operations. Further, embodiments described hereinafter may be performed on device structures comprising square or rectangular trenches or round holes. In one embodiment, a mask material 402 may be blanketed on a top surface 404 of the third layer 330 and the second surface 206 of the dielectric material 210. The mask material 402 may then be selectively removed to expose the dielectric material 210 to be etched. The dielectric material 210 and associated plurality of sidewalls 313 may be etched by any suitable method, such as a plasma assisted dry etch. Etching the dielectric material 210 may remove a portion of the second surface 206 and create an exposed region 408 of the third layer 330. The critical dimension of the third layer 330 prior to performing a critical dimension reduction process (described hereinafter) may be between about 200 Å to about 1000 Å. After a desired amount of dielectric material 210 has been removed, the mask material 402 may also be removed from the top surface 404 of the third layer 330 by a convention mask removal process selected to avoid damaging the top surface 404 of the third layer 330.

Figure 4B:
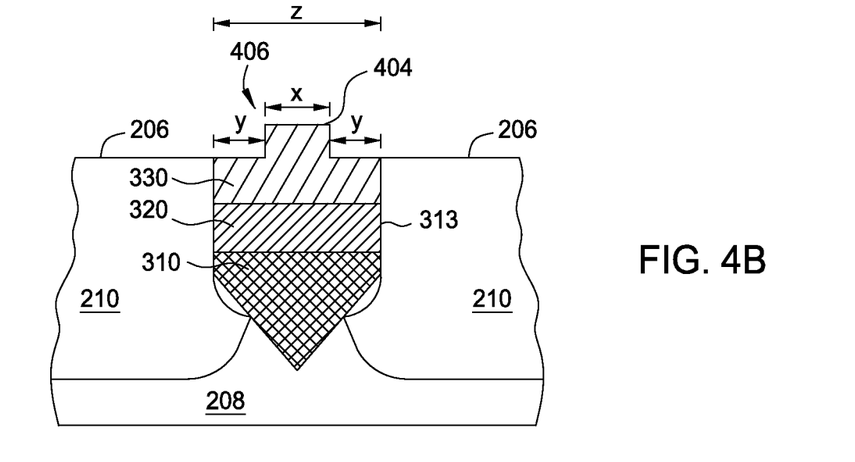

Finally, at optional operation 170, illustrated in FIG. 4B, the third layer 330 may be etched to reduce the critical dimension of the third layer 330. In one embodiment, the exposed region 408 (FIG. 4A) may be anisotropically wet etched. In this embodiment, an anisotropic wet etch chemistry may be selected to directionally etch only the third layer 330. An etch solution, such as sulfuric acid ($H_2SO_4$) and hydrogen peroxide ($H_2O_2$), or citric acid ($C_6H_8O_7$) and hydrogen peroxide ($H_2O_2$), may be provided to the exposed region 408. The etch solution may be selective for the specific material of the third layer 330 and may etch the third layer in a manner substantially co-planar with the second surface 206 of the dielectric material 210. The etching process may be allowed to proceed for a desired amount of time to achieve a desired reduction "y" in the critical dimension "z" of the third layer 330. The anisotropic wet etch may be stopped and the third layer 330 having a reduced critical dimension "x" may be formed. In certain embodiments, the reduced critical dimension "x" may be between about 50 Å and about 150 Å.

Figure 5:
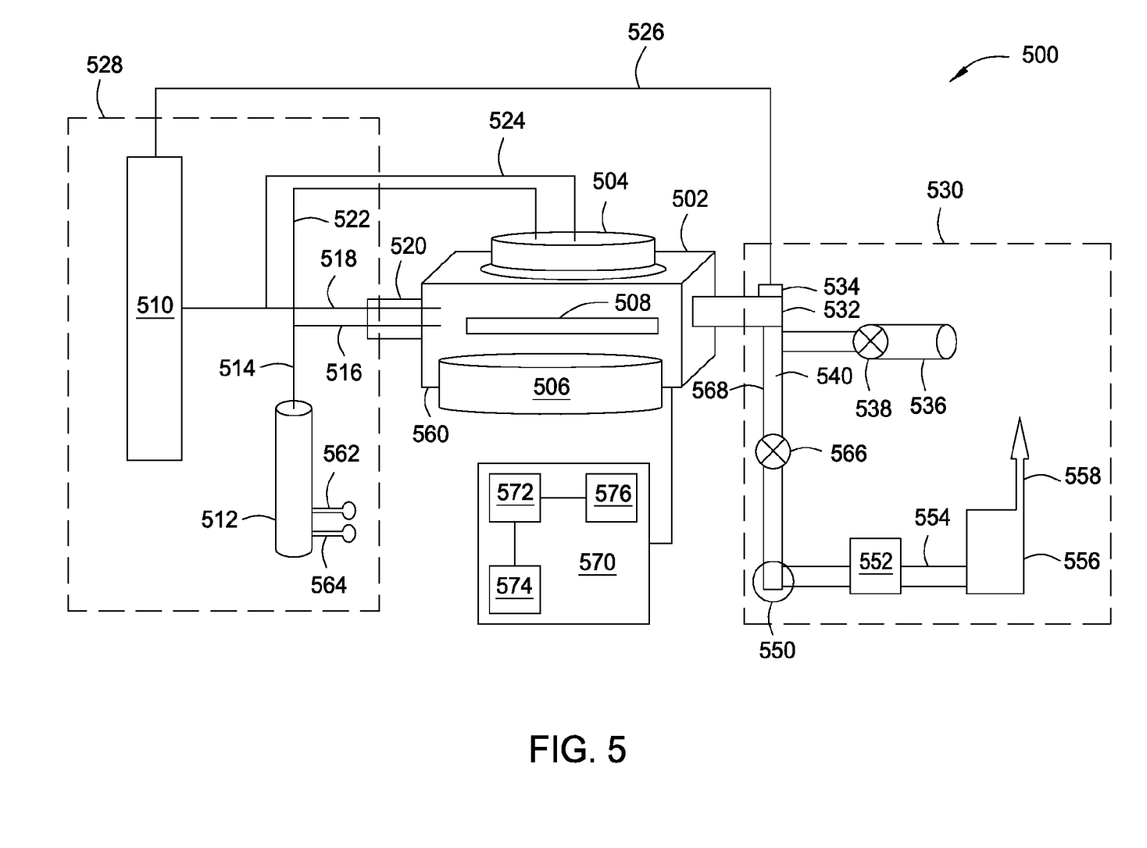
FIG. 5 depicts a schematic diagram of an apparatus for depositing a layer on a substrate according to certain embodiments described herein.

FIG. 5 depicts a schematic diagram of an apparatus 500 for depositing a layer on a substrate. More specifically, the apparatus 500 may be used to deposit a Group III-V layer on a silicon substrate. The apparatus 500, such as the Centura® Epi™ 300 mm chamber or 300 mm xGen™ chamber, both available from Applied Materials, Inc., Santa Clara, Calif., may be adapted to make and use embodiments described herein. Other chambers available from Applied Materials, Inc. or other manufacturers may also be modified or used in accordance with the teachings provided herein.

In certain embodiments, a processing chamber 502 may have a substrate support 508, which may be a rotating substrate support, disposed therein. The substrate support 508 may also be a plate heated by embedded heating elements, or a ring or support pins. A heat source 506 may be disposed facing one side of the substrate support 508. In one embodiment, a heat source may be embedded in the substrate support 508 or, in another embodiment, a plurality of lamps (not shown) may be adapted to heat the chamber 502 and a substrate being processed therein. The processing chamber 502 may comprise a showerhead 504 for gas entry into the chamber 502. Alternatively, or in combination, gas may be provided to the processing chamber 502 via a side entry 520 coupled to a side wall 560 of the chamber 502.

A feed system 528, which may include a gas delivery system 510 and a liquid or solid precursor contact chamber 512, may be coupled to the chamber 502 through a plurality of conduits. A first conduit 522 and a second conduit 524 may couple the feed system 528 to the optional showerhead 504. The showerhead 504 may be a dual-pathway showerhead to prevent mixing of the precursors prior to entry into the chamber 502. In certain embodiments, cross-flow gas injection may be practiced by providing first and second cross-flow conduits 516 and 518 to the side entry 520. The apparatus 500 may contain either a showerhead configuration or a cross-flow injection configuration, or both.

The gas delivery system 510 and contact chamber 512 may deliver Group III precursors or Group V precursors, or both Group III and Group V precursors simultaneously or sequentially. In certain embodiments, carrier gases, such as nitrogen ($N_2$) and or hydrogen ($H_2$), may be flowed with the Group III or Group V precursors to the chamber 502. The gas delivery system 510 may also deliver deposition or selectivity control species to the chamber 502. The feed system 528 may include liquid or gaseous sources and controls (not shown), which may be configured in an enclosed cabinet.

The contact chamber 512 may be coupled to either the side entry point 520 or the showerhead 504 by a conduit 514 adapted to carry a liquid or solid precursor to the chamber 502. Conduits 514, 516, and 522 may be heated to a temperature between about 50° C. and about 200° C. to control or prevent condensation of the precursor being transferred therein. The contact chamber 512 may contain a liquid organometallic, a bed of solid metal, or metal halide crystals. The aforementioned materials may be sublimed into a carrier gas provided through one or both of gas feed conduits 562 and 564. In one embodiment, a halogen gas source may be provided through a first gas feed conduit 562 while a carrier gas may be provided through a second gas feed conduit 564. The gases, either for subliming or reacting, may be flowed through a liquid organometallic, powdered metal, or metal halide fluidized bed to enhance contacting. A mesh strainer or filter may be used to prevent entrainment of particles into the chamber 502. In another embodiment, the gases may flow across a fixed solid metal or metal halide bed.

An exhaust system 530 may be coupled to the chamber 502. The exhaust system 530 may be coupled to the chamber 502 at any convenient location, which may be dependent upon the location of the gas entry into the chamber 502. In embodiments where gas entry is provided through the showerhead 504, the exhaust system 530 may be coupled to a bottom wall of the chamber 502 around the heat source 506 by one or more portals or through an annular opening. In certain embodiments, an annular manifold (not shown) may be disposed near an edge of the substrate support 508 and may be coupled to the exhaust system 530. In embodiments utilizing cross-flow, the exhaust system 530 may be coupled to a sidewall of the chamber opposite the side entry 520.

An exhaust conduit 540 may couple an exhaust cap 532 to a vacuum pump 552 through a throttle valve 566. A jacket 568 may encompass the exhaust conduit 540 and throttle valve 566 from the exhaust cap 532 to an inlet 550 of the vacuum pump 552. The jacket 568 enables thermal control of the exhaust conduit 540 to prevent condensation of exhaust species. A heating medium, such as steam, hot air, water, or other hot fluid, may be used to maintain the exhaust conduit 540 at a temperature above a dew point of the exhaust gas. In certain embodiments, the jacket 568 may include resistive heating elements, for example, an electric blanket. A condensation trap 536 may be coupled to the exhaust conduit 540 by a valve 538, if desired, to further enhance trapping of any condensates in the exhaust system 530. The vacuum pump 552 may provide exhaust species to an abatement system 556 through an abatement conduit 554 and cleaned gas exhaust 558. To further reduce wetting or nucleation in the exhaust conduit 540, the exhaust conduit 540 may be coated with quartz or with an inert polymer material.

Plasma or ultraviolet activated cleaning agents may be coupled into the exhaust system 530 by an active source 534, which may be coupled to a microwave or RF chamber for generating cleaning species. A cleaning gas line 526 may provide cleaning gases from the gas delivery system 510 to the exhaust conduit 540, proceeding through the active source 534, if desired. Use of active species for cleaning may provide for cleaning to proceed at reduced temperatures.

A controller 570 may be provided and may be coupled to various components of the apparatus 500 to control the operation thereof. The controller 570 may include a central processing unit (CPU) 572, a memory 574, and support circuits 576. The controller 570 may control the apparatus 500 directly, or via computers (or controllers) associated with particular process chamber and/or support system components. The controller 570 may be one of any form of general purpose computer processors that can be used in an industrial setting for controlling various chambers and sub-processors. The memory 574, or computer readable medium, of the controller 570 may be one or more of readily available memory such as random access memory (RAM), read only memory (ROM), floppy disk, hard disk, optical storage media, flash drive, or any other form of digital storage, local or remote. The support circuits 576 may be coupled to the CPU 572 for supporting the processor in a conventional manner. The support circuits 576 may include, cache, power supplies, clock circuits, input/output circuitry and subsystems, and the like. Methods described herein may be stored in the memory 574 as a software routine that may be executed or invoked to control the operation of the process chamber 502 in the manner described herein. The software routine may also be stored and/or executed by a second CPU (not shown) that may be remotely located from the hardware being controlled by the CPU 572.

While the foregoing is directed to embodiments of the present invention, other and further embodiments of the invention may be devised without departing from the basic scope thereof, and the scope thereof is determined by the claims that follow.

The invention claimed is:
1. A method of forming a device structure, comprising:
providing a substrate having a surface oriented in a <111> direction;
forming a trench having a first region and a second region, wherein a width of the first region corresponds to a width of the surface oriented in a <111> direction, the trench comprising sidewalls, wherein the sidewalls contact the substrate below the surface oriented in a <111> direction;
depositing a first layer on the surface oriented in a <111> direction;
depositing a second layer on the first layer; and depositing a third layer on the second layer, wherein each of the first layer, second layer, and third layer independently comprise at least one of a Group III element and at least one of a Group V element.

2. The method of claim 1, wherein the surface oriented in a <111> direction is a silicon-containing surface.

3. The method of claim 1, wherein the second region is disposed adjacent the sidewalls.

4. The method of claim 1, wherein the sidewalls comprise a dielectric material.

5. The method of claim 1, wherein the first layer comprises Ga, Al, and As.

6. The method of claim 5, wherein the second layer comprises In, Ga, Al, and As in a first molar ratio.

7. The method of claim 6, wherein the third layer comprises In, Ga, Al, and As in a second molar ratio different from the first molar ratio.

8. The method of claim 1, wherein the first later, second layer, and third layer are deposited epitaxially.

9. A method of forming a device structure, comprising:
providing a substrate having a surface oriented in a <111> direction;
forming a trench having a first region and a second region, the trench comprising sidewalls, wherein the sidewalls contact the substrate below the surface oriented in a <111> direction;
depositing a first layer on the surface oriented in a <111> direction, wherein a portion of the sidewalls in the second region remains substantially free from deposition of the first layer;
depositing a second layer on the first layer; and
depositing a third layer on the second layer, wherein each of the first layer, second layer, and third layer independently comprise at least one of a Group III element and at least one of a Group V element.

10. A method of forming a device structure, comprising:
providing a substrate having a surface oriented in a <111> direction;
forming a trench having a first region and a second region, the trench comprising sidewalls, wherein the sidewalls contact the substrate below the surface oriented in a <111> direction;
depositing a first layer on the surface oriented in a <111> direction, wherein the trench has an aspect ratio of less than 1 and comprises a thickness of the first layer less than a sum of a width of the first region and two times a width of the second region when the width of the first region is less than two times the width of the second region;
depositing a second layer on the first layer;
depositing a third layer on the second layer, wherein each of the first layer, second layer, and third layer independently comprise at least one of a Group III element and at least one of a Group V element;
removing a portion of the sidewalls to expose a portion of the third layer; and
etching the third layer to reduce a critical dimension of the third layer.

11. The method of claim 10, further comprising masking the third layer during a dry etch of the sidewalls.

12. The method of claim 11, wherein the etching the third layer comprises anisotropic wet etching.

13. The method of claim 12, wherein an etchant used to etch the third layer comprises at least one of sulfuric acid, citric acid, hydrogen peroxide, and combinations and mixtures thereof.

14. The method of claim 10, wherein the third layer has an initial critical dimension of between about 20 nm and about 100 nm.

15. The method of claim 14, wherein the critical dimension of the third layer is reduced to between about 5 nm and about 15 nm.

16. A method of forming a device structure, comprising:
providing a substrate having a surface oriented in a <111> direction;
forming a trench having a first region and a second region, the trench comprising sidewalls, wherein the sidewalls contact the substrate below the surface oriented in a <111> direction;
depositing a first layer on the surface oriented in a <111> direction, wherein the trench has an aspect ratio equal to 1 and comprises a thickness of the first layer equal to a sum of a width of the first region and two times a width of the second region when the width of the first region is equal to two times the width of the second region;
depositing a second layer on the first layer;
depositing a third layer on the second layer, wherein each of the first layer, second layer, and third layer independently comprise at least one of a Group III element and at least one of a Group V element;
removing a portion of the sidewalls to expose a portion of the third layer; and
etching the third layer to reduce a critical dimension of the third layer.

17. A method of forming a device structure, comprising:
providing a substrate having a surface oriented in a <111> direction;
forming a trench having a first region and a second region, the trench comprising sidewalls, wherein the sidewalls contact the substrate below the surface oriented in a <111> direction;
depositing a first layer on the surface oriented in a <111> direction, wherein the trench has an aspect ratio greater than 1 and comprises a thickness of the first layer greater than a sum of a width of the first region and two times a width of the second region when the width of the first region is greater than two times the width of the second region;
depositing a second layer on the first layer;
depositing a third layer on the second layer, wherein each of the first layer, second layer, and third layer independently comprise at least one of a Group III element and at least one of a Group V element;
removing a portion of the sidewalls to expose a portion of the third layer; and
etching the third layer to reduce a critical dimension of the third layer.

* * * * *